(12) United States Patent
Fan et al.

(10) Patent No.: US 8,433,987 B2
(45) Date of Patent: Apr. 30, 2013

(54) METHOD FOR HIGH-EFFICIENT IMPLEMENTATION OF DE-RATE MATCHING INCLUDING HARQ COMBINING FOR LTE

(75) Inventors: Wei Fan, Shanghai (CN); Weifeng Li, Shanghai (CN); Jiajun Zhang, Boxborough, MA (US)

(73) Assignee: Texas Instruments Incorporated, Dallas, TX (US)

( * ) Notice: Subject to any disclaimer, the term of this patent is extended or adjusted under 35 U.S.C. 154(b) by 306 days.

(21) Appl. No.: 12/869,901

(22) Filed: Aug. 27, 2010

(65) Prior Publication Data

US 2011/0145670 A1 Jun. 16, 2011

(51) Int. Cl.
*H03M 13/03* (2006.01)
(52) U.S. Cl.
USPC .......................................... 714/790; 714/774

(58) Field of Classification Search ............. 714/790, 714/774
See application file for complete search history.

(56) References Cited

U.S. PATENT DOCUMENTS

| | | | |
|---|---|---|---|
| 2003/0235147 A1* | 12/2003 | Walton et al. ................. | 370/204 |
| 2009/0201849 A1* | 8/2009 | Sawahashi et al. ........... | 370/328 |
| 2009/0271687 A1* | 10/2009 | Lee et al. ...................... | 714/784 |
| 2010/0158053 A1* | 6/2010 | Kim et al. ..................... | 370/536 |

* cited by examiner

*Primary Examiner* — M. Mujtaba K Chaudry
(74) *Attorney, Agent, or Firm* — Steven A. Shaw; W. James Brady; Frederick J. Telecky, Jr.

(57) ABSTRACT

Embodiments of the invention provide a method of de-rate matching without NULL bits skipping. Date is received without NULLs and inputted into a LLR combining block. The history data without NULLs is buffered. Log-likelihood ratio (LLR) combining is called before de-rate matching. The output of LLR combining is de-interleaved. The reading pointer is offset to forge NULLs. Finally, de-interleaving output without NULLs is sent to a turbo decoder.

3 Claims, 12 Drawing Sheets

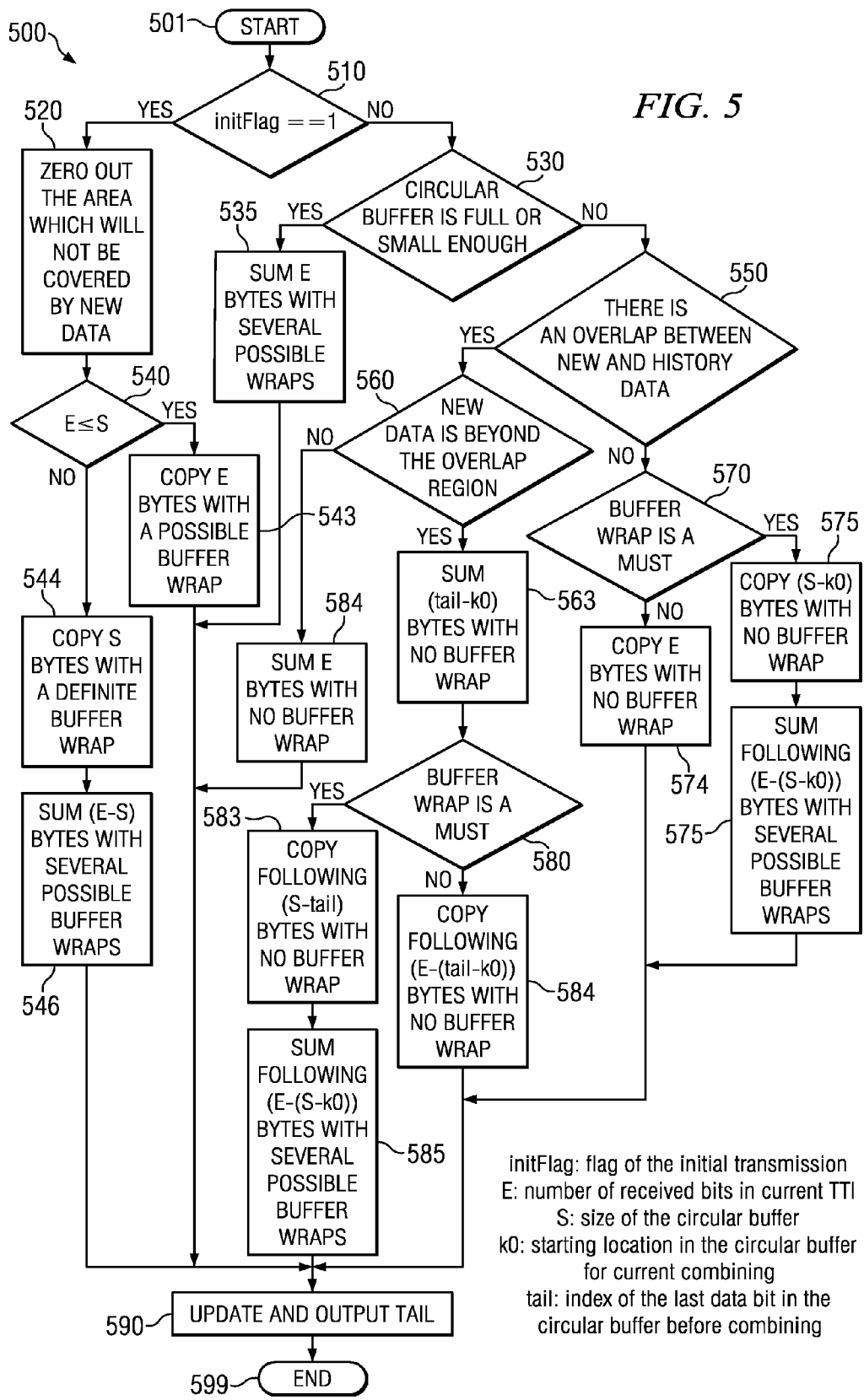

METHOD FOR HIGH-EFFICIENT IMPLEMENTATION OF DE-RATE MATCHING INCLUDING HARQ COMBINING FOR LTE

CROSS REFERENCE TO RELATED APPLICATIONS

This application claims priority under 35 U.S.C. §120 to PCT Application Number PCT/CN2009/001413 filed Dec. 10, 2009 which claims priority to U.S. Provisional Application No. 61/121,774, filed on Dec. 11, 2008 incorporated herein by reference.

BACKGROUND

Embodiments of the invention are directed, in general, to communication systems and, more specifically, to de-rate matching in communication systems.

The following abbreviations may be utilized herein:
3GPP 3rd Generation Partnership Project
ACK acknowledgement
ARQ automatic repeat-request
BCH broadcast channel
BCCH broadcast control channel
BLER block error rate
CQI channel quality indicator
CRC cyclic redundancy check
D-BCH dynamic broadcast channel
DCCH dedicated control channel
DL downlink (Node B to UE)
DL-SCH downlink shared channel
DTCH dedicated traffic channel
E-UTRAN evolved universal terrestrial radio access network (LTE of UTRAN)
F filler bits
HARQ hybrid automatic repeat-request
L1 layer 1 (physical layer, PHY)
LTE long term evolution of UTRAN (E-UTRAN)
LLR Log-Likelihood Ratio
MAC medium access control (layer 2, L2)
MIB master information block
NACK negative acknowledgement
ND number of padding bits
Node B base station
PDCCH physical downlink control channel
RV redundancy version
rvidx redundancy version index
TTI Transmission Time Interval
UE user equipment, such as a mobile station or mobile terminal
UL uplink (UE to Node B)

Consider the currently proposed channel coding of system information in E-UTRAN. One element comprises using the BCCH logical channel, as mapped to the BCH transport channel, to transmit at least a portion of system information. Currently, the transport format is of a fixed, though as yet unspecified (i.e., undetermined), size. The channel coding rate is assumed to be implicitly given by the combination of transport block size, modulation and resource assignment. Furthermore, no BCH HARQ is employed.

HARQ is a scheme for re-transmitting a packet to compensate for an erroneous packet. In particular, HARQ is useful for instances when an error occurs in the reception of an initially transmitted data packet. HARQ functionality helps ensure accurate delivery between peer entities at L1. HARQ uses multiple stop-and-wait processes operating in parallel. For example, for each transport block received in the UL, an acknowledgment is transmitted from the Node B to the UE after the receiver of the Node B performs a CRC to indicate a successful decoding (ACK) or to request a retransmission of the erroneously received transport block (NACK). UL signaling includes the one-bit HARQ positive/negative acknowledgement (HARQ-ACK/NACK), and five-bit measurement report (CQI), as non-limiting examples. At the Node B, the UL signaling information or status report is processed by a MAC sublayer. These ACK/NACK messages are generally transmitted with special physical layer signaling independent of data transmission.

HARQ may also be used in the DL in a similar manner. Currently, E-UTRAN utilizes HARQ in both the UL and DL. As such, for each transport block received in the DL by the UE, a HARQ message (i.e., ACK or NACK) is transmitted from the UE to the Node B. An ACK is signaled after the receiver of the UE performs a CRC that indicates a successful decoding while a NACK comprises a request for retransmission of an erroneously received (e.g., erroneously decoded) transport block.

Reference with regard to Universal Mobile Telecommunications System (UMTS) design document for channel coding to "3rd Generation Partnership Project 3GPP TS-36.212 v8.4.0 (Release 8) http://www.3gpp.org/ftp/specs/html-info/136212.htm; for Physical Layer Procedures to 3GPP TS-36.213 v8.4.0 (Release 8) hit http://www.3gpp.org/ftp/specs/html-info/36213.htm. Said documents incorporated by reference.

BRIEF DESCRIPTION OF THE DRAWINGS

Figure 1:
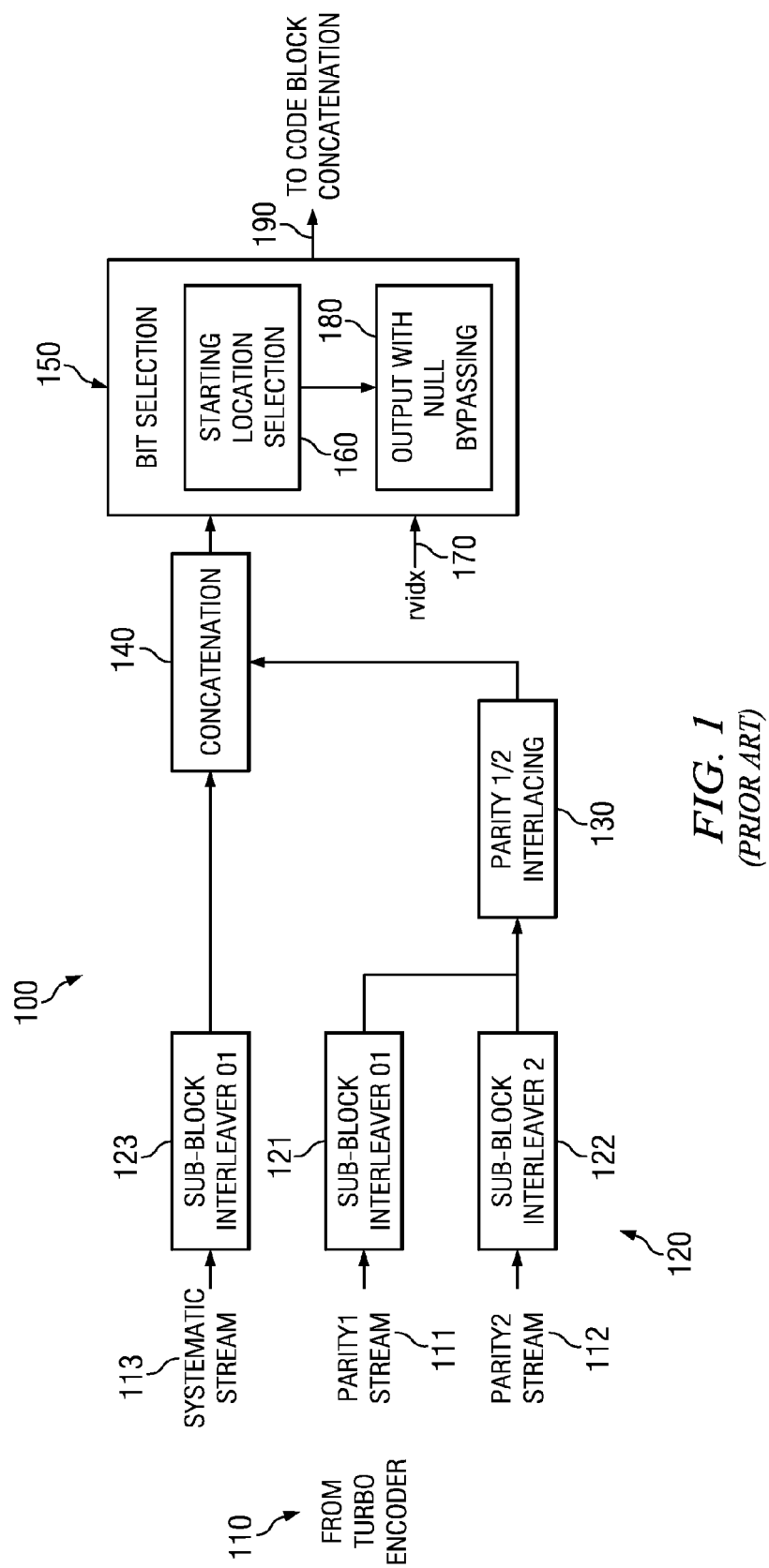

Having thus described the invention in general terms, reference will now be made to the accompanying drawings, which are not necessarily drawn to scale, and wherein:

FIG. 1 is a block diagram illustrative of a rate matching stage as known in the art.

Figure 2:
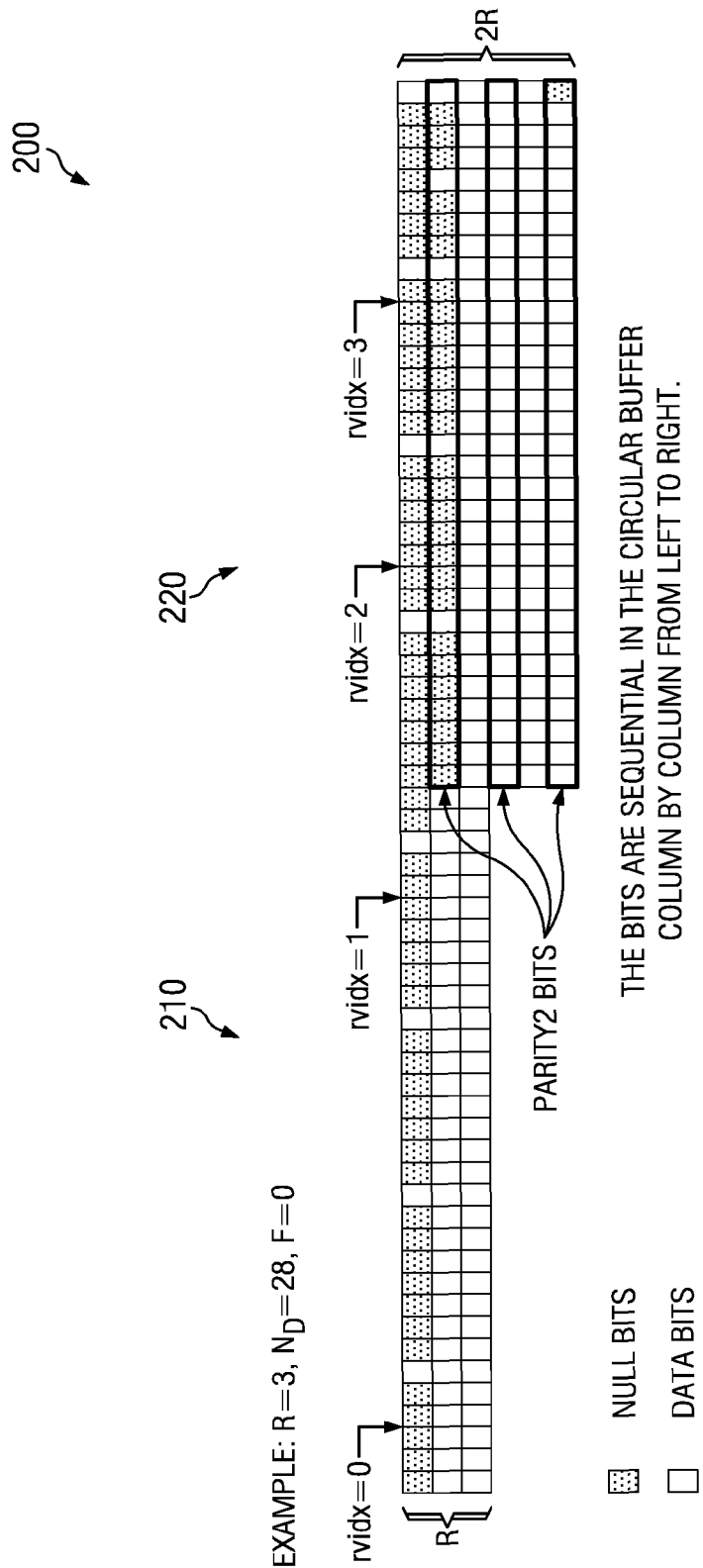

FIG. 2 shows an example of the dual-matrix structure.

Figure 3:
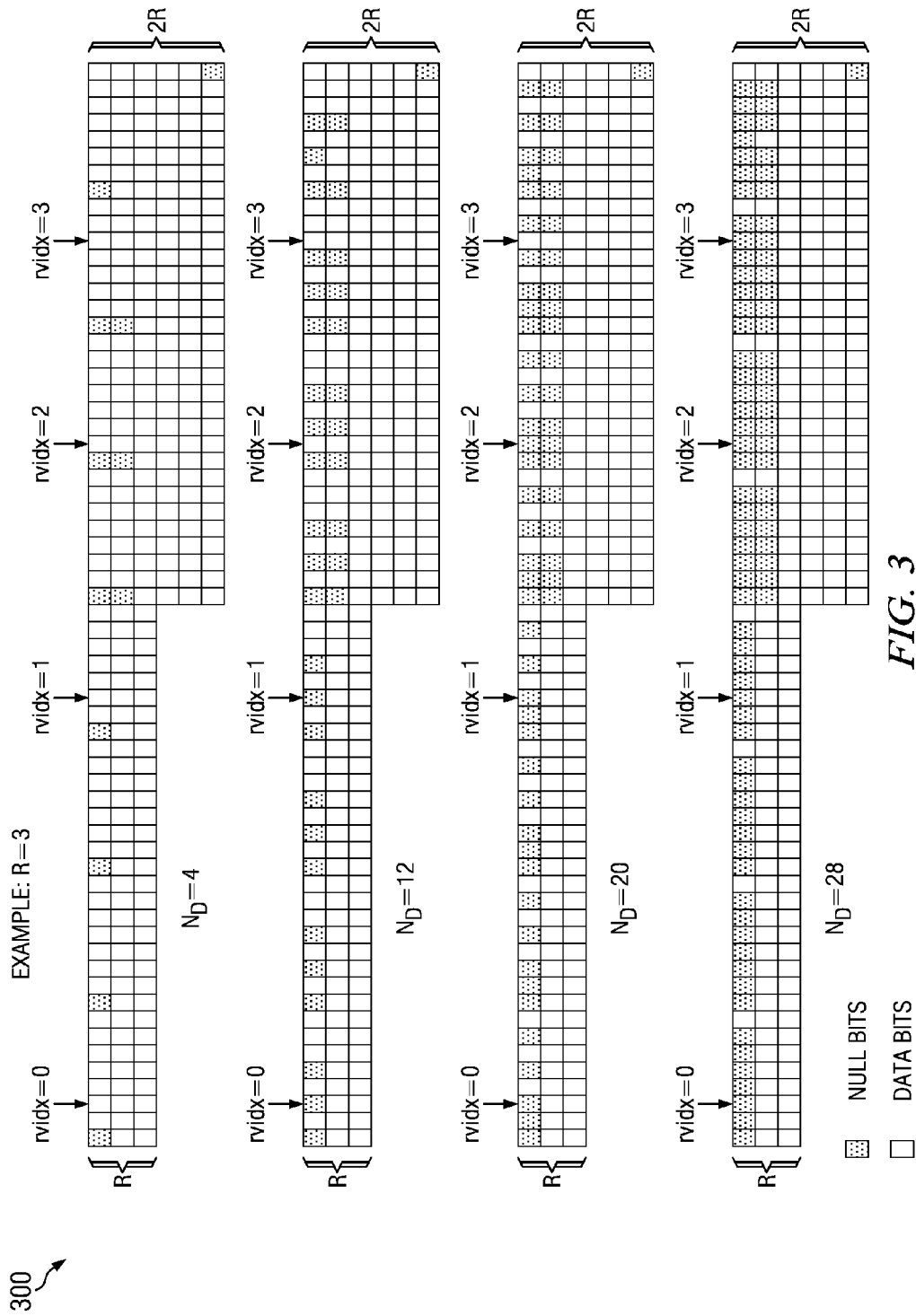

FIG. 3 shows all possible NULL bit patterns when F=0.

Figure 4:
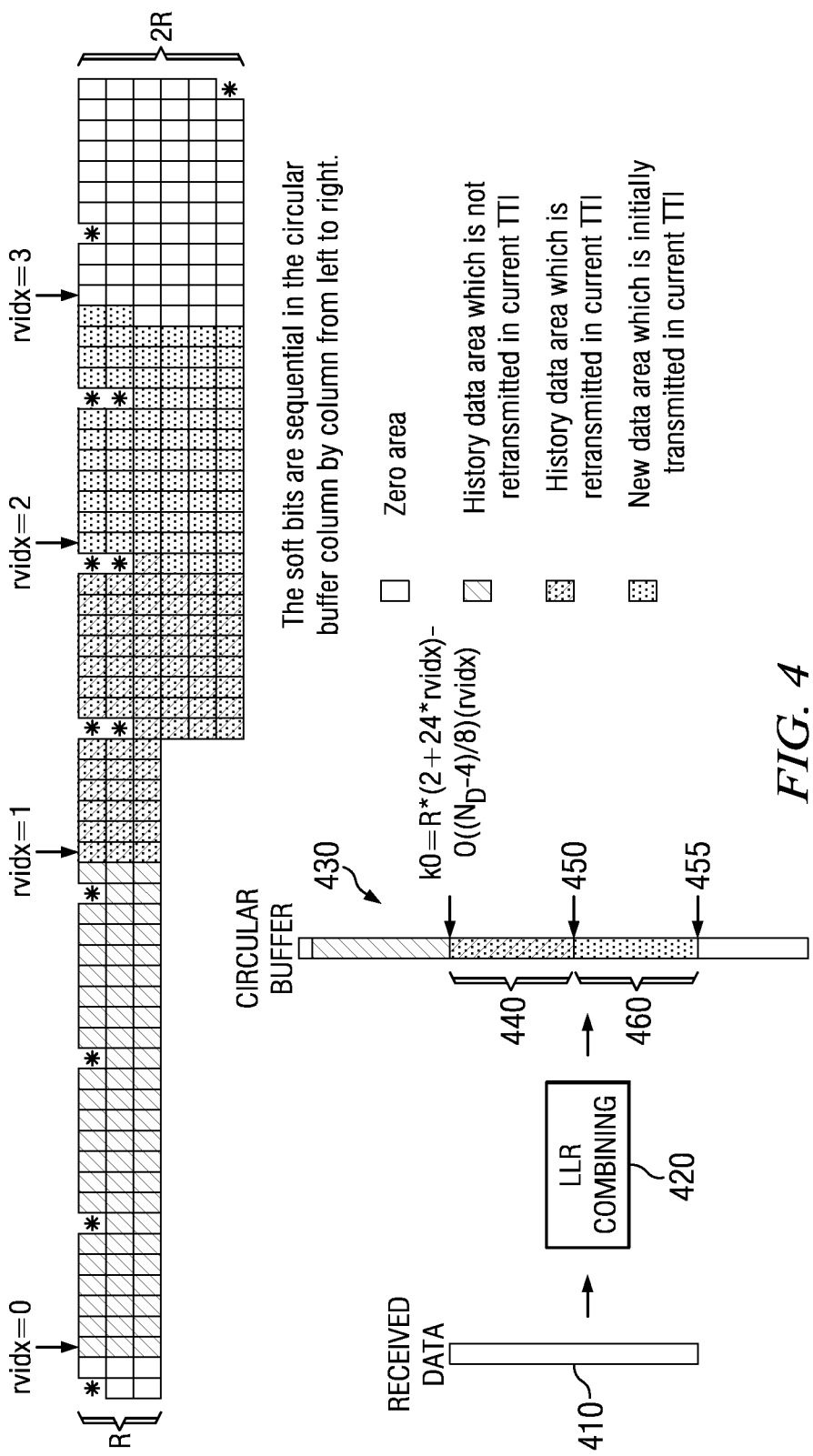

FIG. 4 shows an example of a Log-Likelihood Ratio LLR combining stage in accordance with embodiments of the invention.

FIG. 5 is a flowchart illustrative of Log-Likelihood Ratio LLR combining in accordance with embodiments of the invention.

Figure 6A:
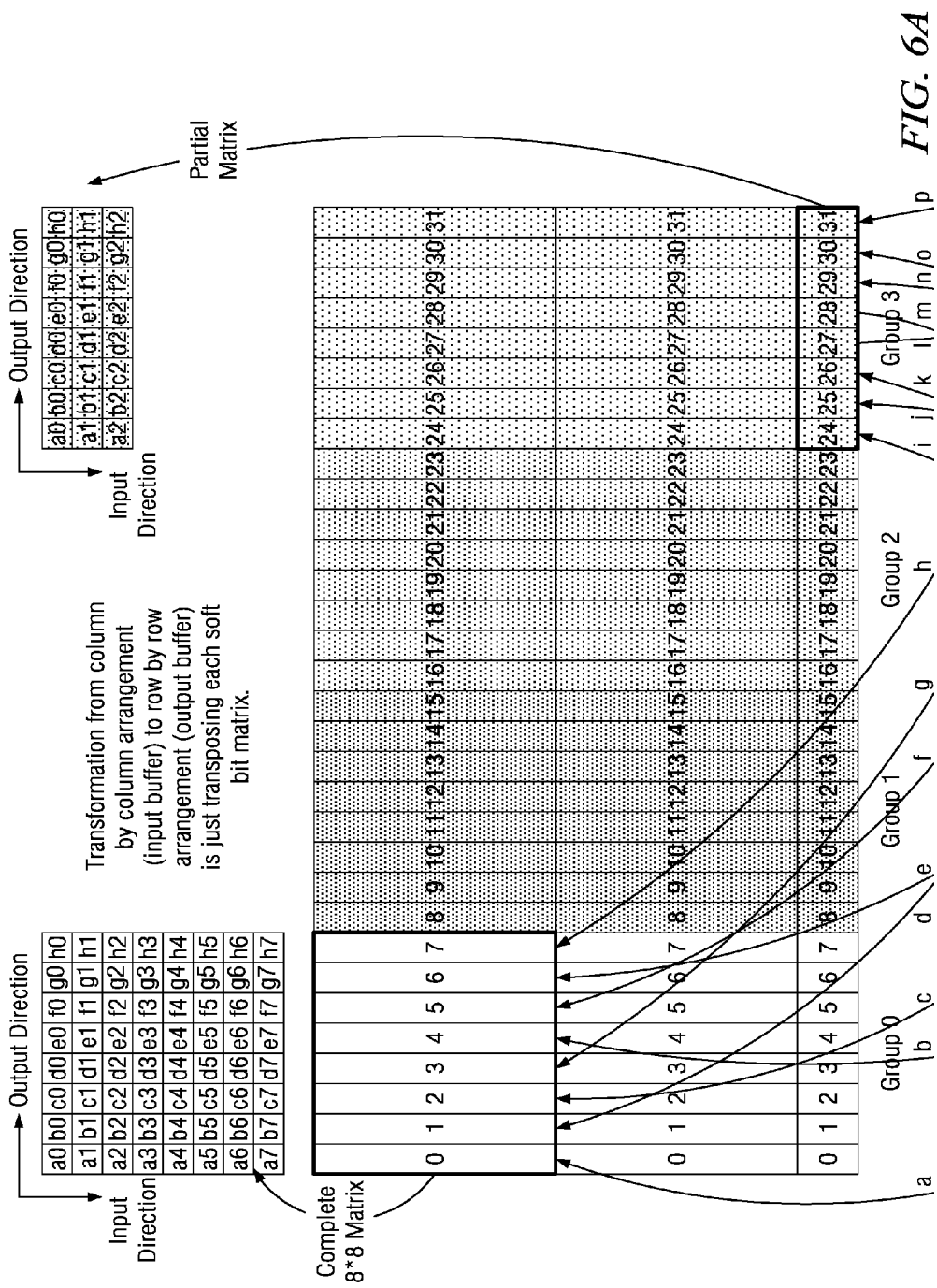
Figure 6B:
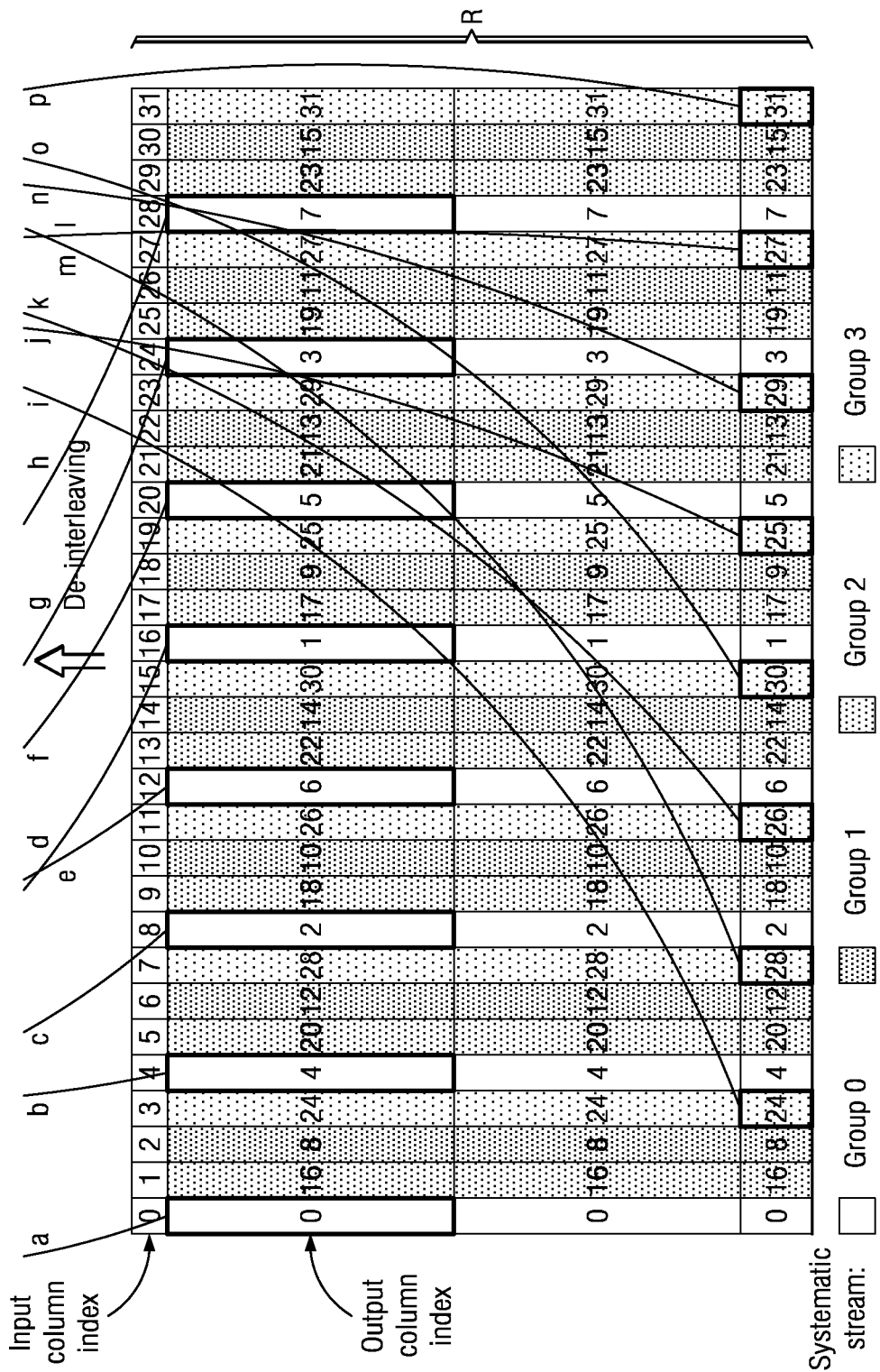

FIG. 6 depicts the group partition in the systematic matrix.

Figure 7:
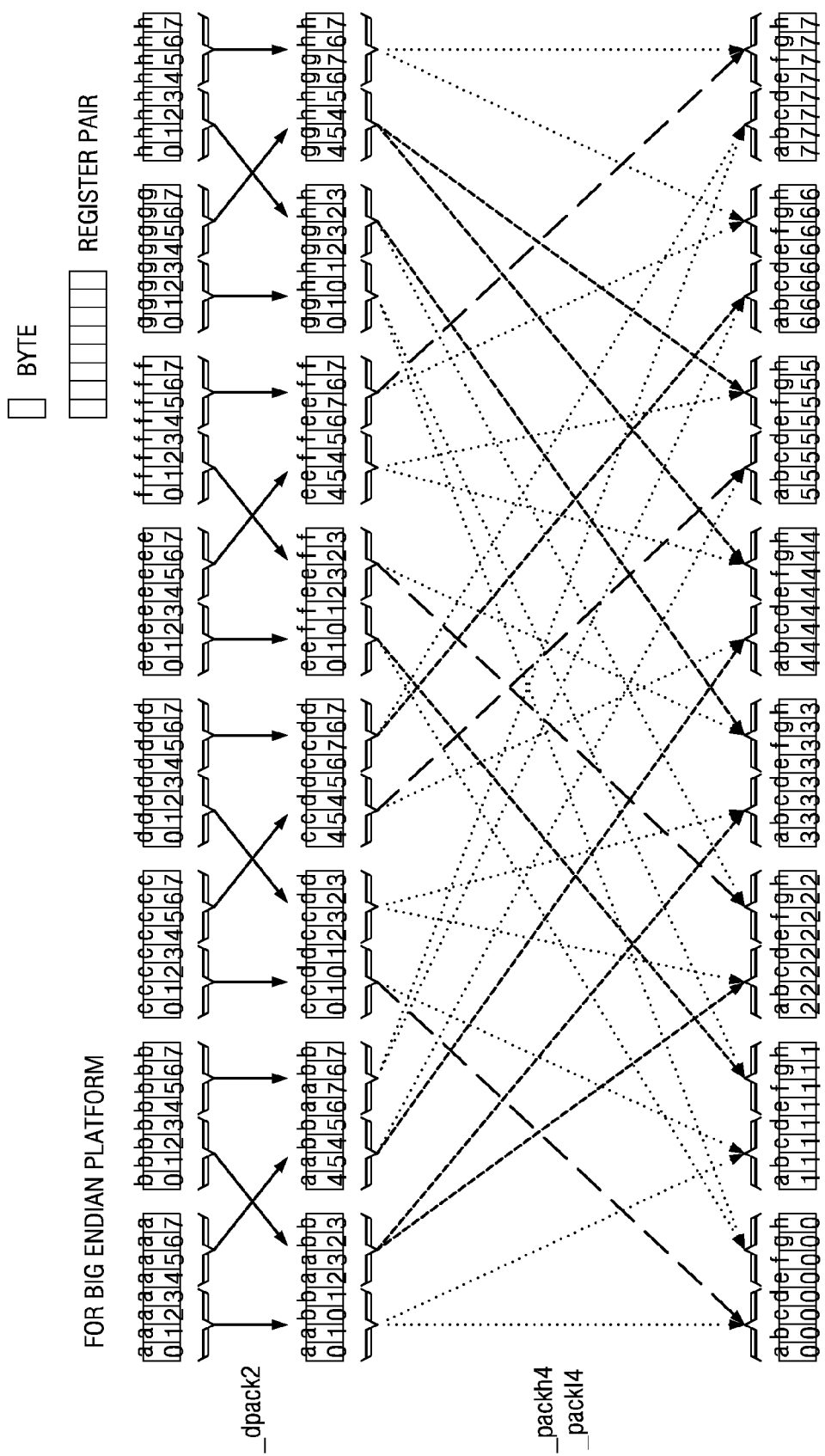

FIG. 7 shows that the processing flow of matrix transposing is identical with that for systematic stream.

Figure 8A:
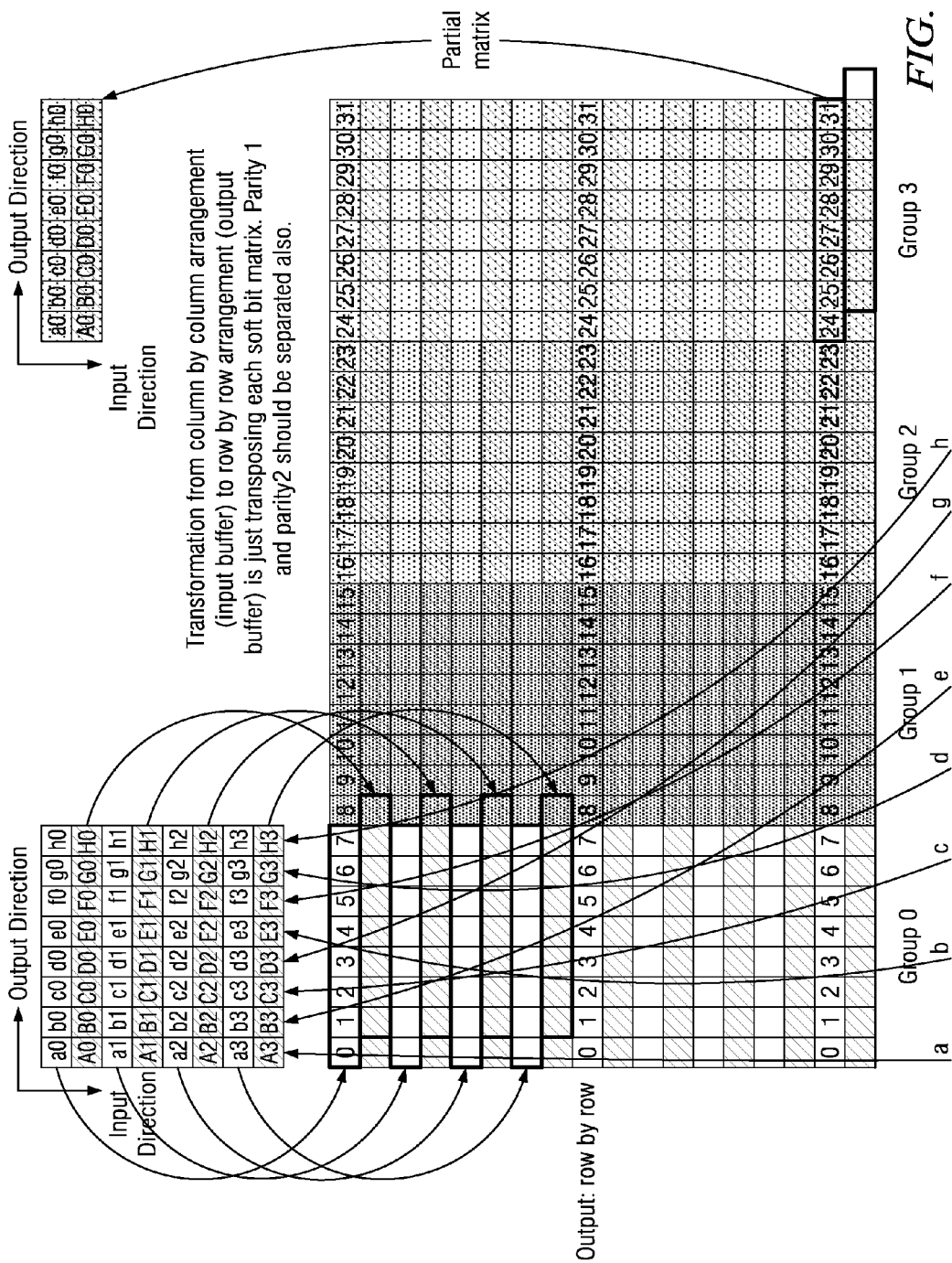
Figure 8B:
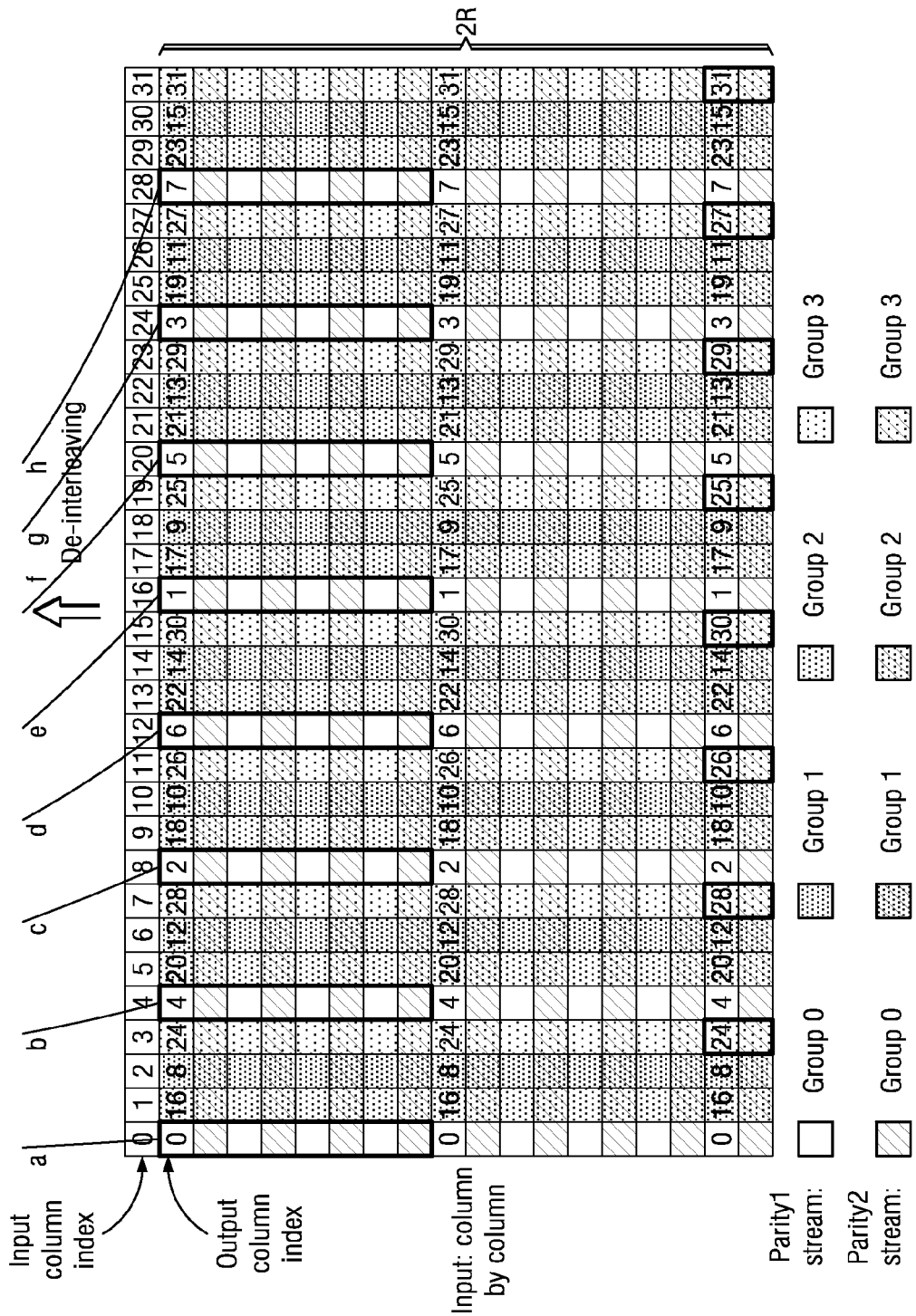

FIG. 8 depicts the group partition in the interlaced parity matrix.

Figure 9:
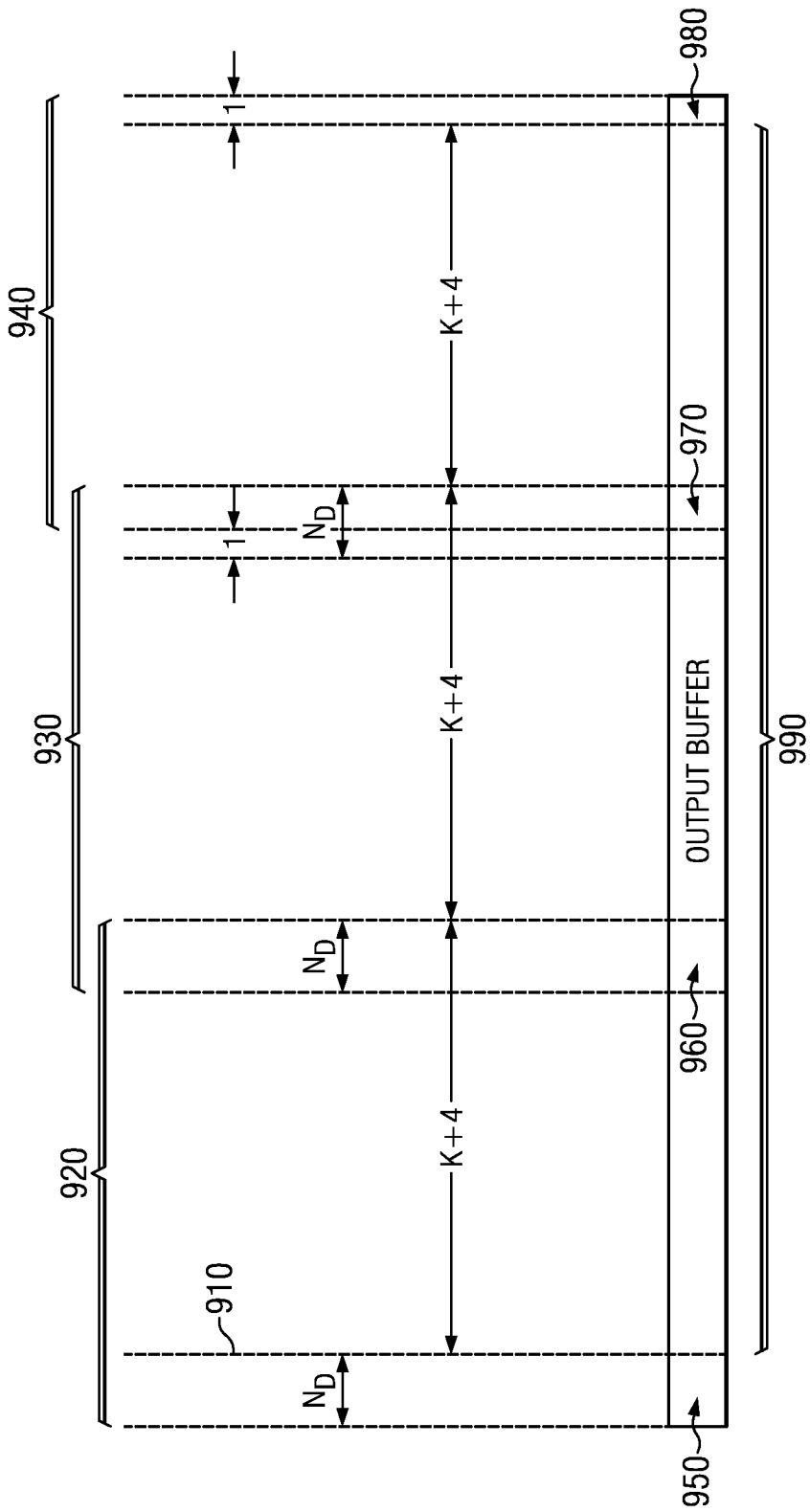

FIG. 9 depicts output buffer arrangement.

Figure 10:
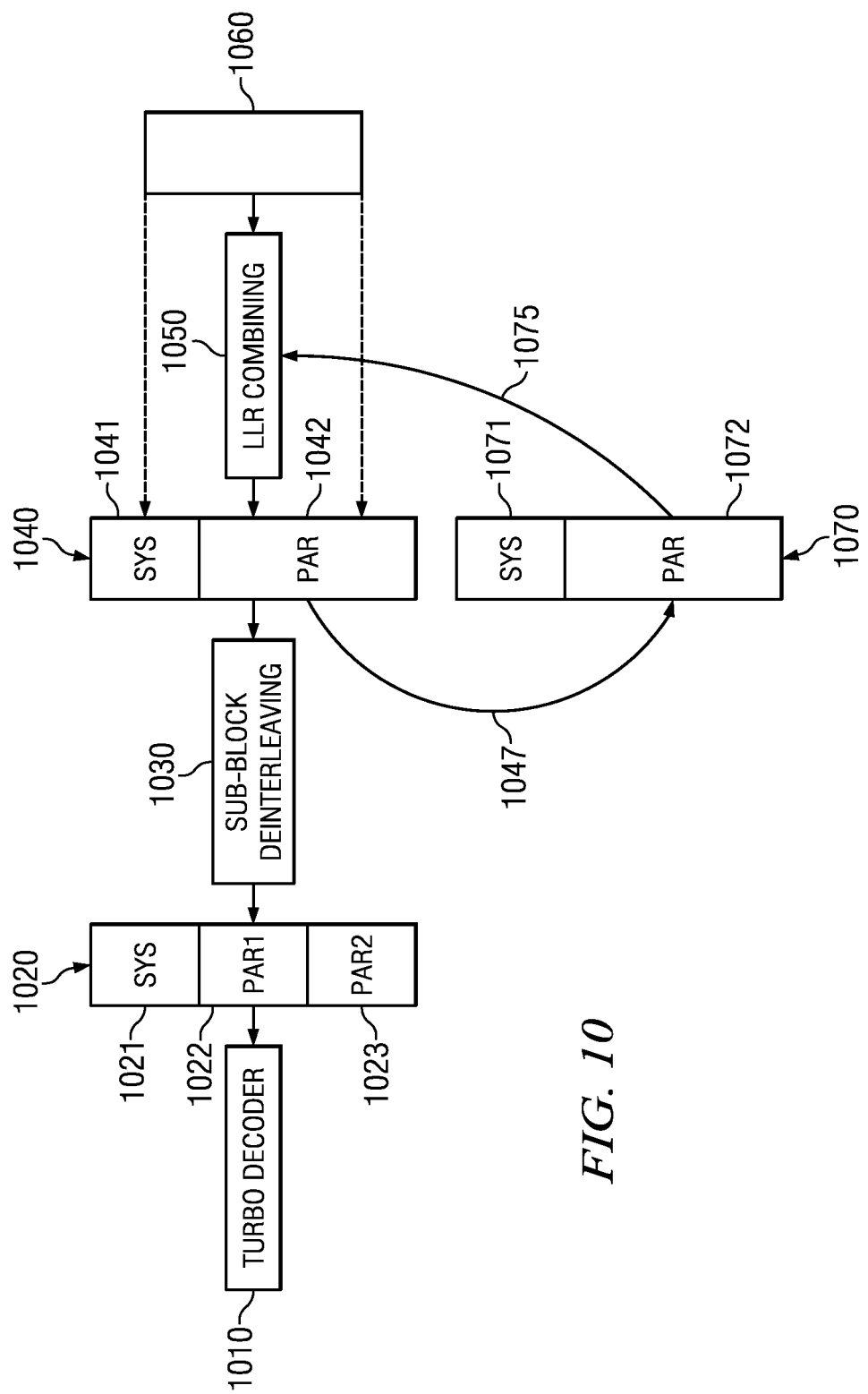

FIG. 10 is flow diagram illustrative of the output buffer arrangement.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Rate Matching at the Transmitter

The de-rate matching stage of the bit processing performed on the uplink is the inverse process of the rate matching stage performed in UE. This rate matching stage must be completed for each code block of each allocation.

The rate matching stage as in known in the art is depicted as 100 in FIG. 1. Section 5.1.4.1 of 3rd Generation Partnership Project (3GPP) TS-36.212 v8.4.0 (Release 8).

The output from turbo encoder 110 has three streams which are called systematic 113, parity1 111 and parity2 112 respectively. Each stream passes through a sub-block interleaver 120. The interleaver for the systematic stream 123 and the interleaver for parity1 stream 121 have the same structure (called sub-block interleaver 01 here) and the interleaver for the parity2 stream 122 is different (called sub-block interleaver 2 here).

After sub-block interleaving, parity1 and parity2 streams are interlaced with each other 130. The resultant stream is then concatenated with the output of the interleaver of the systematic stream. The concatenation 140 starts with the output of the interleaver 123 of the systematic stream and followed by the interlaced stream. The buffer used to hold the concatenation output is called virtual circular buffer 150.

There are four permissible starting locations in the virtual circular buffer 150 having starting location selection 160 and output with NULL bypassing 180. The specific starting location for the current transmission is selected by the redundancy version index, denoted by rvidx 170. There are NULL bits in the virtual circular buffer which are dummy bits generated during the code block segmentation stage before turbo encoder and during the sub-block interleaving stage. These NULL bits will be removed from the output sequence. The rate matching module outputs the bits 190 in the virtual circular buffer bit by bit starting from the location identified by rvidx, skipping NULL bits.

According to 3GPP TS-36.212 v8.4.0, there are two kinds of NULL bits generated at the transmitter, one called filler bits generated during code block segmentation and the other called padding bits generated during sub-block interleaving.

Filler bits can only exist in the systematic and parity1 streams of the first code block of a transport block and its number is denoted by F per stream. The number of filler bits, F, of the systematic stream and that of parity1 stream of one code block are always identical. If there were no restrictions on the transport block size, then the value of F could range from 0 to 63.

Padding bits can exist in any code block of a transport block and its number is denoted by ND per stream. The number of padding bits, ND, stays the same for all the streams of a code block. According to Table 5.1.3-3 of 3GPP TS-36.212 v8.4.0, the code block size K is always a multiple of 8. After turbo coding, the block size increases to K+4. So, the value range of ND is 4, 12, 20 and 28 which are all of the possible remainder of 8x+4 divided by 32.

The bits in the virtual circular buffer 150 have a dual-matrix-like internal structure. We call this dual-matrix as interleaver dual-matrix. FIG. 2 shows an example of the interleaver dual-matrix structure. The interleaver dual-matrix structure 200 is formed by sequentially taking the bits from the virtual circular buffer 150. Keeping the structure of this dual-matrix in mind clearly is the key to understanding the design. The interleaver dual-matrix structure 200 is a back to back combination of the systematic matrix 210 and the interlaced parity matrix 220, R is the number of rows in the systematic matrix, and ND and F are defined as above.

Receiver Design

Embodiments of the invention simplify the de-rate matching stage. The improvements provided by the embodiments depend heavily on a new feature introduced in the 8.4.0 specification version. According to 3GPP TS-36.212 v8.4.0, there are two kinds of NULLs as described above. However, according to Table 7.1.7.2.1-1 of 3GPP TS-36.213 v8.4.0 (Release 8), which lists all of the allowed transport block sizes, F is always equals to 0. Table 7.1.7.2.1-1 of 3GPP TS-36.213 v8.4.0 is updated to meet the F=0 feature in 8.4.0 specification version and this feature will be exploited below to simplify the de-rate matching stage. A future specification could simplify the description related to filler bits.

Referring to FIG. 3, which shows all possible NULL bit patterns when F=0. Based on F=0, all three streams of any code block have the same number of NULLs, which can be 4, 12, 20 or 28, denoted by ND, and the distribution of NULLs in the interleaver dual-matrix 300 can be deduced and summarized as four patterns which are depicted in FIG. 3, each pattern corresponding to an allowed ND. Note that there isn't a situation in that a data bit is between two NULL bits at the top of a column, making the NULL bypassing method in Bypassing NULLs section feasible.

LLR Combining

In prior designs, Log-Likelihood Ratio (LLR) combining is called after de-interleaver. Since the updated soft bits are diffused in the output buffer of de-interleaver, it is difficult to sum and memory move only for them. The worst case of the system burden often happens when the code rate is near to 1, and at this time, only about ⅓ soft bits in the circular buffer are updated in a Transmission Time Interval (TTI). So, if the soft bits can be summed and memory moved only for the updated part, considerable processing capacity and memory throughput are saved.

To clarify the improvement of the embodiments of the invention for the saving of memory throughput, consider a worst case:
 there is a cell with 20 MHz bandwidth;
 uplink MU-MIMO is enabled;
 there are two spatial multiplexing users which occupy the whole cell bandwidth;
 the modulation type is 64QAM,
 the code rate is 1; and
 both of users are using the largest transport block size (75376 bits).

In this scenario, the soft bit number in the circular buffers in a TTI is about 456 Kbytes. If the history buffers are located in a double data rate DDR memory and the circular buffers have to be loaded and stored integrally, the DDR throughput is about 2*3.6=7.2 Gbps. However, if only the updated part is stored in DDR, the DDR throughput is only about (1+⅓)* 3.6=4.8 Gbps, saving about 2.4 Gbps. Assuming that we use a DDR memory with 32 bits bus width and 250 MHz clock frequency with the rise and fall clock edges valid, the academic bandwidth of this DDR memory is 16 Gbps and the actual bandwidth can be taken as about 12 Gbps. All in all, the saving of DDR throughput is considerable (20% reduction in this example).

In embodiments of the invention, Log-Likelihood Ratio (LLR) combining is called before de-rate matching. The history buffer doesn't contain NULLs and can be combined with the receiving buffer easily without concern for NULLs, once the starting location in the history buffer for the current transmission (called k0) is known. FIG. 4 shows an example of the LLR combining stage 420. O(i)(j) in FIG. 4 is used to calculate k0 and denotes the number of NULLs in the interleaver dual-matrix in front of the starting location of current transmission, where i denotes ND case index and i=0, 1, 2, 3 correspond to ND=4, 12, 20, 28 respectively, and j denotes rvidx. According to FIG. 3, O(i)(j) can be calculated easily and the result is summarized in Table 2. The 'tail' comprising input tail 450 and output tail 455 in FIG. 4 denotes index of the last data bit in the circular buffer 430 plus 1 and is useful to determine the summation area 440 and copy area 460. LLR combining module 420 updates and outputs the value of 'tail' for the next retransmission. Tail may be updated to 455 by the LLP combining module 420

TABLE 1

Sub-block interleaver column permutation for systematic and parity1 streams

| Number of columns | Inter-column permutation pattern for de-interleaving |
|---|---|
| $C_{subblock}^{TC}$<br>32 | $<P'(0), P'(1), \ldots, P'(C_{subblock}^{TC} - 1)>$<br><0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31> |

TABLE 2

Sub-block interleaver column permutation for parity2 streams

| Number of columns | Inter-column permutation pattern for parity2 stream |
|---|---|
| $C_{subblock}^{TC}$<br>32 | $<P_\pi(0), P_\pi(1), \ldots, P_\pi(C_{subblock}^{TC} - 1)>$<br><1, 17, 9, 25, 5, 21, 13, 29, 3, 19, 11, 27, 7, 23, 15, 31, 2, 18, 10, 26, 6, 22, 14, 30, 4, 20, 12, 28, 8, 24, 16, 0> |

TABLE 3

Number of NULLs in the interleaver dual-matrix in front of the starting location of a transmission

| O | rvidx = 0 | rvidx = 1 | rvidx = 2 | rvidx = 3 |
|---|---|---|---|---|
| ND = 4 | 1 | 4 | 8 | 10 |
| ND = 12 | 1 | 10 | 20 | 30 |
| ND = 20 | 2 | 17 | 32 | 48 |
| ND = 28 | 2 | 23 | 44 | 66 |

For reducing the processing resource usage further, copy operation may be performed instead of summation as far as possible, since copy is faster. FIG. 5 depicts a flowchart of the Log-Likelihood Ratio LLR combining which outlines how summation is avoided. Note that sometimes we do summation although it is possible to replace it by copy for simpler code and better execution efficiency for small code blocks.

Flowchart 500 starts at 501. At 510, an initial flag (initFlag) is tested for equaling 1. If initFlag not=1, a test of circular buffer is performed to determine if buffer is full or small enough 530.

If buffer is full or small enough, the number of received bits in current TTI (E) is summed 535 and process proceeds to 590.

If initFlag=1, the area not to be covered by new data is set to zero 520. A determination if the number of received bits in current TTI (E) is less than or equal to the size of the circular buffer 540. If the number of received bits in current TTI (E) is less than or equal to the size of the circular buffer, the E bytes are copied with possible buffer wrap 543. If the number of received bits in current TTI (E) is greater than the size of the circular buffer, the size of the circular buffer (S) bytes are copied with definite buffer wrap 544; (E-S) bytes are summed with several possible buffer wraps 546; and processing proceeds to 590.

If buffer is not full nor small enough it is determined if there is an overlap between new and history data 550. If there is an overlap between new and history data and the new data is beyond the overlap region 560, the starting location in the circular buffer for current combining (k0) is subtracted from the index of the last data bit in the circular buffer before combining (tail). The (tail-k0) bytes are summed with no buffer wrap 563. If the new data is not beyond the overlap region, the E bytes are summed with no buffer wrap and the processing continues to 590.

From 563, if buffer wrap is a must 580, the (S-tail) bytes are copied with no buffer wrap 583, the value of (E-S-k0) bytes are summed with several possible buffer wraps 585, and processing continues to 590.

If buffer wrap is not a must 580, the (E-(tail-k0) bytes are copied with no buffer wrap 584, processing proceeds to 590.

If there is not an overlap between new and history data 550 and buffer wrap is not a must 570, the E bytes are copied with no buffer wrap 574. The (E-S-k0) bytes are summed with several possible buffer wraps 577. Processing proceeds to 590.

De-Rate Matching

The embodiments of the invention split the de-rate matching stage into three stages: NULL insertion, stream separation and de-interleaving. Every stage involves in some kind of data processing and memory moving. The NULL insertion and stream separation stages make the input to the de-interleaver more regular and allow for a simpler de-interleaving operation. However, this functional splitting is not a must. The three stages are merged into a single stage and the execution efficiency is improved greatly. Embodiments of the invention are presented in the following order:

De-interleaving for systematic streams;
De-interleaving for interlaced parity streams;
Bypassing NULLs without data re-arrangement.

De-Interleaving for Systematic Streams

Suppose that the input of the de-interleaver for the systematic streams contains NULLs in the correct locations, so that we can see the data block to be de-interleaved as a complete R*32 matrix (the systematic matrix in FIG. 2). The way to handle NULLs which in fact do not exist in the input buffer of de-interleaver will be given in Bypassing NULLs section below.

The soft bits in the systematic matrix are separated into 4 groups based on the input column indices from the viewpoint of de-interleaver:

Group0's input column indices: [0, 16, 8, 24, 4, 20, 12, 28];
Group1's input column indices: [2, 18, 10, 26, 6, 22, 14, 30] which are just group0's indices plus 2;
Group2's input column indices: [1, 17, 9, 25, 5, 21, 13, 29] which are just group0's indices plus 1;
Group3's input column indices: [3, 19, 11, 27, 7, 23, 15, 31] which are just group0's indices plus 3.

Each group's input column indices are ordered such that the corresponding output column indices after inverting the inter-column permutation performed at the transmitter are sequential from 8*i to 8*i+7 for group i, where 0<=i<=3.

We process the groups in ascending order, group0 the first and group3 the last. Within each group, there are N complete 8*8 soft bit matrices and 0 or 1 M*8 partial matrix, where 0<M<8 and 8*N+M=R, and we process these matrices from top to bottom. The input buffer arranges the soft bits of the systematic matrix column by column, and the output buffer arranges them row by row. For each complete (8*8) or partial (M*8) soft bit matrix, the transformation from input to output is just a matrix transposing. FIG. 6 depicts the group partition in the systematic matrix, the soft bit matrix partition in each group and the matrix transposing via an example, where N=2 and M=3.

For each 8*8 soft bit matrix, we load 8 columns into 8 register pairs by _mem8 instructions, with each register pair holding one column (8 bytes). Following FIG. 6, we denote the 8 input register pairs as a0a1a2a3a4a5a6a7, b0b1b2b3b4b5b6b7, c0c1c2c3c4c5c6c7, d0d1d2d3d4d5d6d7, e0e1e2e3e4e5e6e7, f0f1f2f3f4f5f6f7, g0g1g2g3g4g5g6g7 and h0h1 h2h3h4h5h6h7. For the k-th column of the j-th soft bit matrix in the i-th group, the loading address offset to the beginning of the input buffer is $R*P'(8*i+k)+8*j$, where $P'(x)$ is defined in Table 1.

After matrix transposing, 8 output register pairs are generated as a0b0c0d0e0f0g0h0, a1b1c1d1e1f1g1h1, a2b2c2d2e2f2g2h2, a3b3c3d3e3f3g3h3, a4b4c4d4e4f4g4h4, a5b5c5d5e5f5g5h5, a6b6c6d6e6f6g6h6 and a7b7c7d7e7f7g7h7, with each register pair holding one row (8 bytes), which are saved by _mem8 instructions. For the k-th row of the j-th soft bit matrix in the i-th group, the saving address offset to the beginning of the output buffer is $32*(8*j+k)+8*i$.

The optimized processing flow for transformation from the 8 column register pairs to the 8 row register pairs is depicted in FIG. 7. FIG. 7 is for the big endian platform and the processing flow for the little endian platform is different but with the same principle. For the partial matrix, transposing can be performed just as the complete matrix, except that the final memory savings are executed conditionally.

De-Interleaving for Interlaced Parity Streams

Again, suppose that the input of the de-interleaver for the interlaced parity streams contains NULLs in the correct locations, so that we can see the data block to be de-interleaved (and de-interlacing) as a complete 2R*32 matrix (the interlaced parity matrix in FIG. 2). The way to handle NULLs which in fact do not exist in the input buffer of de-interleaver will be given in Bypassing NULLs section below.

The soft bits in the interlaced parity matrix are separated into 4 groups based on the input column indices and the rule is identical with systematic streams in the last section.

We process the groups in ascending order, group0 the first and group3 the last. Within each group, there are N complete 8*8 soft bit matrices and 0 or 1 M*8 partial matrix, where M∈[2, 4, 6] and 8*N+M=2R, and we process these matrices from top to bottom. The input buffer arranges the soft bits of the interlaced parity matrix column by column, and the output buffer arranges them row by row.

Besides the descriptions above which are similar with the systematic stream de-interleaver, we have to separate the two parity streams which are interlaced together. For each complete (8*8) or partial (M*8) soft bit matrix, the transformation from input to output is again a matrix transposing, while saving the even rows to parity1 output buffer and odd rows to parity2 output buffer. FIG. 8 depicts the group partition in the interlaced parity matrix, the soft bit matrix partition in each group and the matrix transposing and stream separation via an example, where N=2 and M=2.

The processing flow of matrix transposing is identical with that for systematic stream and is depicted in FIG. 7. However, following FIG. 8, the 8 input register pairs are denoted as a0A0a1A1 a2A2a3A3, b0B0b1B1b2B2b3B3, c0C0c1C1c2C2c3C3, d0D0d1 D1d2D2d3D3, e0E0e1 E1e2E2e3E3, F0f1F1f2F2f3F3, g0G0g1G1g2G2g3G3 and h0H0h1H1h2H2h3H3, and the 8 output register pairs which are the results of matrix transposing as a0b0c0d0e0f0g0h0, A0B0C0D0E0F0G0H0, a1b1c1d1e1f1g1h1, A1B1C1D1-E1F1G1H1, a2b2c2d2e2f2g2h2, A2B2C2D2E2F2G2H2, a3b3c3d3e3f3g3h3 and A3B3C3D3E3F3G3H3. a0b0c0d0e0f0g0h0, a1b1c1d1e1f1g1h1, a2b2c2d2e2f2g2h2 and a3b3c3d3e3f3g3h3 are saved into parity1 stream output buffer, and A0B1C1D0E0F0G0H0, A1B1C1D1E1F1G1H1, A2B2C2D2E2F2G2H2 and A3B3C3D3E3F3G3H3 are saved into parity2 stream output buffer. The loading address offset for the k-th column of the j-th soft bit matrix in the i-th group is identical with that for the systematic stream, $R*P'(8*i+k)+8*j$. For the 2k-th row of the j-th soft bit matrix in the i-th group, the saving address offset is to the beginning of the parity1 output buffer and should be $32*(4*j+k)+8*i$. For the (2k+1)-th row of the j-th soft bit matrix in the i-th group, the saving address offset is to the beginning of the parity2 output buffer and should be $32*(4*j+k)+8*i+1$, which is explained as below.

According to section 5.1.4.1.1 of 3GPP TS-36.212 v8.4.0, the input of the sub-block interleaver is denoted by $y_k$, and the output of the sub-block interleaver is denoted by $v_0^{(i)}$, $v_1^{(i)}, \ldots, v_{K_\pi}^{(i)}-1$, where i=0, 1, 2 for systematic, parity1 and parity2 streams respectively, and $v_k^{(2)} = y_{\pi(k)}$ where $$\pi(k) = \left(P\left(\left\lfloor \frac{k}{R_{subblock}^{TC}} \right\rfloor\right) + C_{subblock}^{TC} \times (k \bmod R_{subblock}^{TC}) + 1\right) \bmod K_\Pi.$$

Section 5.1.4.1.1 of 3GPP TS-36.212 v8.4.0 doesn't present the expression like π(k) for systematic and parity1 streams, but applies literal description instead. However, π(k)-kind expression for systematic and parity1 streams can be deduced from the literal description and the result is $$\pi'(k) = P\left(\left\lfloor \frac{k}{R_{subblock}^{TC}} \right\rfloor\right) + C_{subblock}^{TC} \times (k \bmod R_{subblock}^{TC}).$$

From the observation that $\pi(k)=(\pi'(k)+1) \bmod K_\pi$, we can see that: for the same output index k of the interleaver, the input index for the parity2 stream π(k) is larger than the input index for the systematic and parity1 streams π(k) by 1, moduled by $K_\pi$. Inversely, for the same input index of the de-interleaver, the output index for the parity2 stream is larger than the output index for the systematic and parity1 streams by 1, moduled by $K_\pi$. Relating this observation with above description, a0b0c0d0e0f0g0h0 and A0B0C0D0E0F0G0H0 are the soft bits from the same input locations of parity1 stream and parity2 stream respectively, so the saving address offset of A0B0C0D0E0F0G0H0 is one byte larger than that of a0b0c0d0e0f0g0h0. Note that the output buffer of the parity2 stream has one byte spilling and the spilled byte should be wrapped into the first byte of the buffer. However, we can ignore this wrapping operation because this byte always holds a NULL bit and the NULLs at the beginning of output buffer are skipped through pointer offsetting before calling turbo decoder, since these NULLs do not involve in turbo decoding. However, we can ignore this wrapping operation because this byte always holds a NULL bit and the NULLs at the beginning of output buffer don't involve in turbo decoding.

Again, we can write custom-built code for some small Rs to improve execution efficiency of small code blocks.

Bypassing NULLs

In the last two sections, we suppose that the input buffer of de-interleaver contains NULLs in the correct locations and give the expressions to calculate the loading address offsets. However, according to the LLR combining section, there are no NULLs in the input buffer of de-interleaver and the address offsets calculated in the way that the last sections present should be subtracted by a revisional value to take NULLs into account. The revisional value of input address offset for the j-th input column is just the total number of NULLs in column 0 to j and depends on ND and whether we are de-interleaving systematic stream or interlaced parity stream. We denote the revisional value by S(i)(j) for the systematic streams and P(i)(j) for the interlaced parity streams, where i denotes ND case index and i=0, 1, 2, 3 correspond to ND=4, 12, 20, 28 respectively, and j denotes the column index and 0<=j<=31. According to FIG. 3, S(i)(j) and P(i)(j) can be calculated easily and the results are summarized in Table 4 and Table 5 respectively. This address adjustment strategy is a key point of PR3 design which makes the multi-stages data processing and memory moving in PR2 needless.

TABLE 4

Input address offset revisional value for systematic streams

| ND | For column 0 to 31 |
|---|---|
| 4 | <1, 1, 1, 1, 1, 1, 1, 1, 2, 2, 2, 2, 2, 2, 2, 2, 3, 3, 3, 3, 3, 3, 3, 3, 4, 4, 4, 4, 4, 4, 4, 4> |
| 12 | <1, 1, 2, 2, 3, 3, 3, 3, 4, 4, 5, 5, 6, 6, 6, 6, 7, 7, 8, 8, 9, 9, 9, 9, 10, 10, 11, 11, 12, 12, 12, 12> |
| 20 | <1, 2, 3, 3, 4, 4, 5, 5, 6, 7, 8, 8, 8, 9, 9, 10, 10, 11, 12, 13, 13, 14, 14, 15, 15, 16, 17, 18, 18, 19, 19, 20, 20> |
| 28 | <1, 2, 3, 4, 5, 6, 7, 7, 8, 9, 10, 11, 12, 13, 14, 14, 15, 16, 17, 18, 19, 20, 21, 21, 22, 23, 24, 25, 26, 27, 28, 28> |

TABLE 5

Input address offset revisional value for interlaced parity streams

| ND | For column 0 to 31 |
|---|---|
| 4 | <2, 2, 2, 2, 2, 2, 2, 2, 4, 4, 4, 4, 4, 4, 4, 4, 6, 6, 6, 6, 6, 6, 6, 6, 7, 7, 7, 7, 7, 7, 7, 7> |
| 12 | <2, 2, 4, 4, 6, 6, 6, 6, 8, 8, 10, 10, 12, 12, 12, 12, 14, 14, 16, 16, 18, 18, 18, 18, 20, 20, 21, 21, 23, 23, 23, 23> |
| 20 | <2, 4, 6, 6, 8, 8, 10, 10, 12, 14, 16, 16, 18, 18, 20, 20, 22, 24, 26, 26, 28, 28, 30, 30, 32, 33, 35, 35, 37, 37, 39, 39> |
| 28 | <2, 4, 6, 8, 10, 12, 14, 14, 16, 18, 20, 22, 24, 26, 28, 28, 30, 32, 34, 36, 38, 40, 42, 42, 44, 46, 48, 49, 51, 53, 55, 55> |

The output of the de-interleaver described above contains ND NULLs at the head of each stream, while the turbo decoder following the de-rate matching stage doesn't need these NULLs. So, we arrange the three streams in the output buffer of de-rate matching as FIG. 9, where K is the code block size before turbo encoder at the transmitter.

FIG. 9 depicts output buffer 900 arrangement. Output buffer of the systematic stream is 920. Output buffer of the parity1 stream is 930. Output buffer of the parity2 stream is 940. Output buffer pointer 910. 950 is the head spilling area of the systematic stream. The interlaced parity stream is de-interleave first and overlapped segment 960 will be overlaid by the output of the following systematic stream de-interleaver. The parity1 storing to overlapped segment 970 is always later than the parity2 storing to the same location. 980 is the tail spilling area of parity2 stream. 990 is decoding data segment.

FIG. 10 is flow diagram illustrative of the output buffer arrangement. Receiving buffer 1060 receives data without NULLs. Data is input into LLR combining block 1050. History data without NULLs comprises two streams systematic 1071 and parity 1072. History data are buffered in the history buffers 1070 located in a DDR memory. LLR combining is called before de-rate matching. The history buffers 1070 do not contain NULLs and may be combined with the receiving buffer 1060 using direct memory access (DMA) 1075 easily without concern for NULLs. The code rate is mostly greater than ⅓ and only the current transmitted part needs to be input into a cache, combined and DMA back to DDR 1047—reducing processing resources and DDR throughput. LLR output without NULLs is sent to sub-block deinterleaver 1030. LLR output is buffered in buffers 1040 and comprises two streams a systematic stream 1041 and a parity stream 1042. Forge NULLs by offsetting reading pointer to load from LLR combining output buffer 1040. Sub-block de-interleaver output without NULLs is sent to the turbo decoder 1010. Sub-block output is buffered in buffers 1020 and comprises three streams systematic 1021, parity1 1022 and parity2 1023.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A method of de-rate matching said method comprising:
   receiving data in a receiving buffer without NULL bits;
   inputting said data into a log-likelihood ratio (LLR) combining block;
   buffering a plurality of history data in one or more history buffers without NULL bits;
   performing log-likelihood ratio (LLR) combining before de-rate matching;
   de-interleaving a LLR combining output from said log-likelihood ratio (LLR) combining without NULL bits;
   forging a plurality of NULL bits by offsetting a reading pointer;
   turbo decoding a de-interleaved output from said de-interleaving without NULL bits; and
   transmitting output using transmitter.

2. The method of claim 1, wherein said history data comprising a systematic stream and a parity stream.

3. The method of claim 1, further comprising combining said receiving buffer and said one or more history buffer using a direct memory access (DMA) process without concern for NULL bits.

* * * * *